(12) United States Patent
Cazzaniga et al.

(10) Patent No.: US 9,517,930 B2
(45) Date of Patent: Dec. 13, 2016

(54) RECOVERY SYSTEM AND METHODS FOR MEMS DEVICES

(71) Applicant: Maxim Integrated Products, Inc., San Jose, CA (US)

(72) Inventors: Gabriele Cazzaniga, Rosate (IT); Luca Coronato, Corsico (IT); Barbara Simoni, Bareggio (IT); Luciano Prandi, Bellinzago Novarese (IT)

(73) Assignee: Hanking Electronics, Ltd., Canton, OH (US)

( * ) Notice: Subject to any disclaimer, the term of this patent is extended or adjusted under 35 U.S.C. 154(b) by 365 days.

(21) Appl. No.: 14/047,944

(22) Filed: Jan. 29, 2014

(65) Prior Publication Data

US 2015/0002982 A1 Jan. 1, 2015

Related U.S. Application Data

(60) Provisional application No. 61/841,006, filed on Jun. 28, 2013.

(51) Int. Cl.
| | |
|---|---|
| *H01G 5/00* | (2006.01) |
| *B81C 1/00* | (2006.01) |
| *B81B 3/00* | (2006.01) |
| *H01H 1/00* | (2006.01) |

(52) U.S. Cl.
CPC ............ *B81C 1/00968* (2013.01); *B81B 3/001* (2013.01); *B81B 3/0056* (2013.01); *B81B 2201/016* (2013.01); *H01H 1/0036* (2013.01)

(58) Field of Classification Search
USPC .......................................... 361/271, 277, 280
See application file for complete search history.

(56) References Cited

U.S. PATENT DOCUMENTS

| | | | | |
|---|---|---|---|---|
| 8,134,375 | B2* | 3/2012 | Boom | G01D 3/08 |
| | | | | 324/661 |
| 2010/0237738 | A1* | 9/2010 | Smith | G11C 23/00 |
| | | | | 310/309 |
| 2014/0217929 | A1* | 8/2014 | Lin | H02N 1/006 |
| | | | | 318/116 |

\* cited by examiner

*Primary Examiner* — Danny Nguyen
(74) *Attorney, Agent, or Firm* — Hartman Global IP Law; Gary M. Hartman; Domenica N. S. Hartman (57) ABSTRACT

Various embodiments of the invention reduce stiction in a wide range of MEMS devices and increase device reliability without negatively impacting performance. In certain embodiments, stiction recover is accomplished by applying electrostatic forces to electrodes via optimized voltage signals that generate a restoring force that aids in overcoming stiction forces between electrodes. The voltage signals used within a stiction recovery procedure may be static or a dynamic, and may be applied directly to existing electrodes within a MEMS device, thereby, eliminating the need for additional components. In some embodiments, the voltage is estimated or calibrated and swept through a range of frequencies that contains one or more resonant frequencies of the mechanical structure that comprises the parts to be detached.

20 Claims, 5 Drawing Sheets

RECOVERY SYSTEM AND METHODS FOR MEMS DEVICES

CROSS REFERENCE TO RELATED PATENT APPLICATIONS

The present application claims priority to U.S. Provisional Application No. 61/841,006, titled "Recovery System for MEMS Devices," filed Jun. 28, 2013, by Gabriele Cazzaniga, Luca Coronato, Barbara Simoni, and Luciano Prandi, which application is hereby incorporated herein by reference in its entirety.

BACKGROUND

A. Technical Field

This present invention relates to integrated micromechanical devices having movable parts and, more particularly, to system and methods of recovering from stiction conditions in micro-electro-mechanical system (MEMS) devices.

B. Background of the Invention

Stiction is an area of concern in MEMS type devices having movable parts. Stiction between two surfaces typically occurs when an external force deflects a movable part in a manner so as to cause a section of its surface to come in physical contact and adhere to a surface of an adjacent stationary part. Sensor type MEMS devices are particularly vulnerable to this intermittent phenomenon, which can be caused by a variety of forces and adversely affects device performance. Forces that tend to cause stiction include: 1) electrostatic forces resulting from a voltage bias or a residual charge present on a surface; 2) capillary forces due to the presence of moisture; and 3) adhesion forces due to surface contamination or process residuals.

For example, in a z-axis MEMS accelerometer, an external disturbance such as a mechanical shock may deflect a suspended proof mass in a manner so as to cause a portion of its surface to contact and adhere to an adjacent wafer substrate surface. When the total adhesion force between the two surfaces is higher than the mechanical restoring force inherent to the proof mass, stiction results and temporarily immobilizes the proof mass preventing it from recovering its original position even after the external disturbance ceases. This renders the device unusable until the stiction force is overcome by a sufficiently large counteracting force.

Since stiction causes the proof mass to adhere to the substrate, the two parts are no longer separated from each other, blocking the movement of the proof mass and, in some cases, also causing a short circuit event that destroys the electric field between the two surfaces. Therefore, the device can no longer measure capacitive changes to derive an acceleration value during the time the stiction condition is present, which affects both device reliability and performance.

Some prior art approaches allow to improve stiction robustness of a device, for example, by increasing material stiffness and, thus, mechanical restoring force in order to aid in releasing the adhered parts of the device. Other approaches improve surface conditions during the fabrication process in order to minimize stiction. However, such improvements result from design tradeoffs that come at the cost of reduced device performance, increased device size, or increased cost of manufacturing. What is needed are tools for MEMS designers to overcome the above-described limitations without increasing device size or sacrificing device performance.

SUMMARY OF THE INVENTION

Various embodiments of the invention utilize a novel stiction recovery system to reduce stiction-related reliability issues in MEMS devices. In certain embodiments of the invention, the stiction recovery system is implemented within an electronic interface circuit of a MEMS device. Stiction recovery of mechanical parts of a mass-spring system is achieved by detecting a stiction event and actively restoring normal operating conditions by applying an electrostatic force on the mechanical structure.

In certain embodiments, an electrostatic force is exerted via a voltage signal that is optimized to generate a restoring force that causes adhered mechanical parts experiencing stiction to successfully detach from each other. The voltage signal can be a static but variable voltage bias or a dynamic signal having a predetermined voltage waveform that is applied to one or more electrodes of the mechanical structure.

In one static mode embodiment, in response to detecting a stiction event via a control circuit, the stiction recovery voltage signal is applied directly to existing sensing electrodes within the MEMS device, such that no additional element or additional area is required on the mechanical part of the device to perform the stiction recovery procedure. In one dynamic mode embodiment, in order to achieve a desired amplitude or recovery time in high-Q systems, the voltage is estimated or calibrated and swept through a range of frequencies that contains one or more resonant frequencies of the mechanical structure that comprises the parts to be detached.

Certain features and advantages of the present invention have been generally described here; however, additional features, advantages, and embodiments presented herein will be apparent to one of ordinary skill in the art in view of the drawings, specification, and claims hereof. Accordingly, it should be understood that the scope of the invention is not limited by the particular embodiments disclosed in this summary section.

BRIEF DESCRIPTION OF THE DRAWINGS

Reference will be made to embodiments of the invention, examples of which may be illustrated in the accompanying figures. These figures are intended to be illustrative, not limiting. Although the invention is generally described in the context of these embodiments, it should be understood that this is not intended to limit the scope of the invention to these particular embodiments.

DETAILED DESCRIPTION OF THE PREFERRED EMBODIMENTS

In the following description, for the purpose of explanation, specific details are set forth in order to provide an understanding of the invention. It will be apparent, however, to one skilled in the art that the invention can be practiced without these details. One skilled in the art will recognize that embodiments of the present invention, described below, may be performed in a variety of ways and using a variety of means. Those skilled in the art will also recognize that additional modifications, applications, and embodiments are within the scope thereof, as are additional fields in which the invention may provide utility. Accordingly, the embodiments described below are illustrative of specific embodiments of the invention and are meant to avoid obscuring the invention.

Reference in the specification to "one embodiment" or "an embodiment" means that a particular feature, structure, characteristic, or function described in connection with the embodiment is included in at least one embodiment of the invention. The appearance of the phrase "in one embodiment," "in an embodiment," or the like in various places in the specification are not necessarily referring to the same embodiment.

Furthermore, connections between components or between method steps in the figures are not restricted to connections that are affected directly. Instead, connections illustrated in the figures between components or method steps may be modified or otherwise changed through the addition thereto of intermediary components or method steps, without departing from the teachings of the present invention.

In this document mass and seismic mass are used interchangeably. While some illustrated embodiments are related to an out-of-plane z-axis accelerometer, the invention can equally be applied to any capacitive MEMS device containing movable mechanical structures, with both in-plane and out-of-plane movement.

Figure 1A:
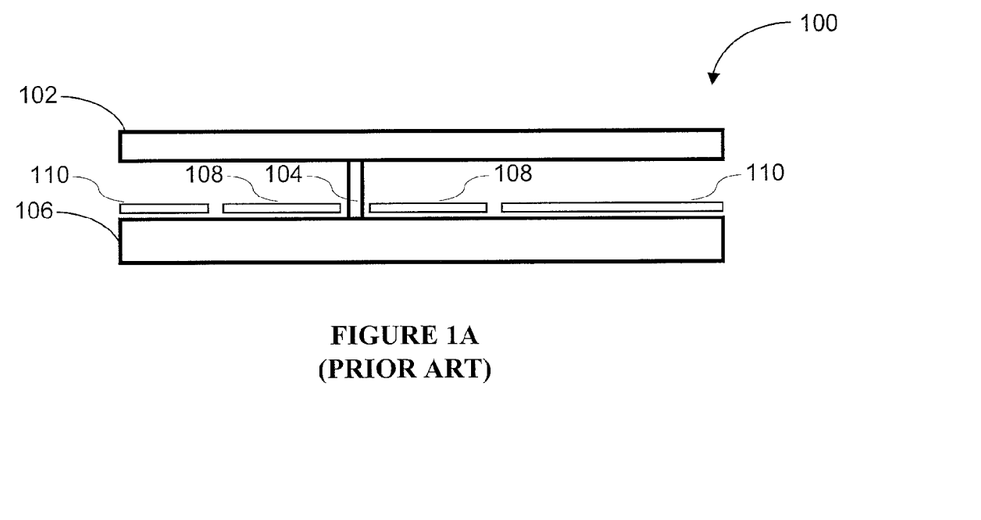
FIG. 1A illustrates a prior art MEMS device in an initial position prior to the application of a force to a movable mass.

FIG. 1A illustrates a prior art MEMS device in an initial position prior to the application of a force to a movable mass. MEMS device 100 is constructed on substrate 106 and comprises seismic mass 102, anchor 104, sensing electrode 108, and stopper electrode 110. Anchor 104 suspends seismic mass 102 and separates it from substrate 106. Seismic mass 102 pivots around the top end of anchor 104. Stopper 110 serves as a contact surface that stops the rotational movement of seismic mass 102 when the movement becomes too large during phases of very high acceleration due to heavy oscillation or mechanical shock.

Figure 1B:
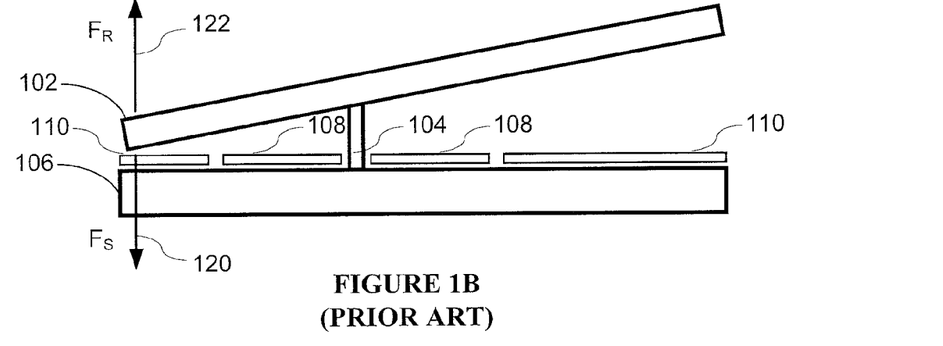
FIG. 1B and FIG. 1C show the MEMS device of FIG. 1A during a stiction condition on one side of the movable mass.
Figure 1C:
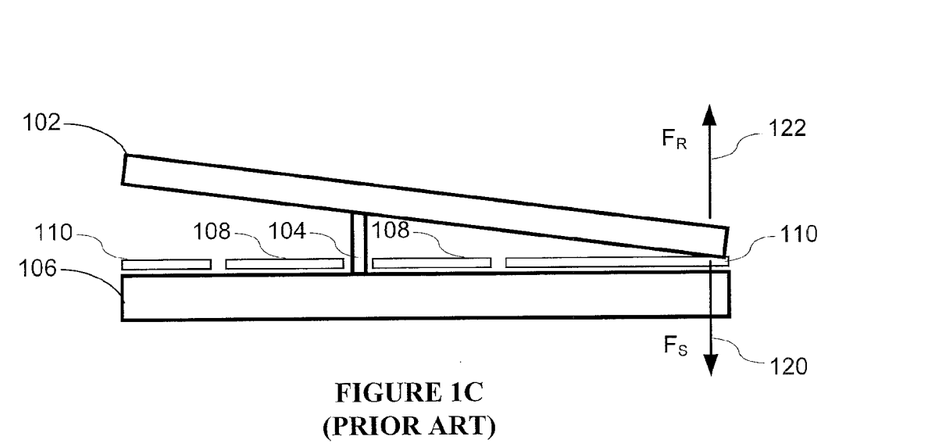

FIG. 1B and FIG. 1C show the MEMS device of FIG. 1A during a stiction condition on one side of the movable mass. During a stiction condition, seismic mass 102 experiences three distinct forces that vectorially add to a total force. First, stiction force 120, which is a function of the adherence properties of the two surfaces. Second, restoring force 122, which is a function of material stiffness. Third, to a lesser degree, an electrostatic force, which is a function of the voltage applied to sensing electrode 108 when measuring the inclination of the structure.

Once the contact force of movable seismic mass 102 on stopper 110 is sufficiently large, e.g., in response to a mechanical shock, the surface on one side of movable seismic mass 102 will tilt and contact the surface of stationary stopper electrode 110 and, if stiction force 120 between the two surfaces is larger than restoring force 122, seismic mass 102 will continue to exert force against the surface of stopper 110 and will not be able to return to its nominal position that was shown in FIG. 1. Instead, as shown in FIG. 1B and FIG. 1C, seismic mass 102 will remain in one of the two positions illustrated in FIG. 1B and FIG. 1C until restoring force 122 exceeds the stiction force 120 in response to, for example, a subsequent shock that releases the two surfaces.

Existing approaches to minimize the occurrence of stiction events include increasing restoring force 122 of seismic mass 102 to counteract stiction force 120. Typically, restoring force 122 is proportional to the stiffness of the material of seismic mass 102. Since material stiffness, in turn, is a function of the elasticity of both material and geometry, designing and fabricating seismic mass 102 with an appropriate stiffness can increase restoring force 122. However, one drawback of this approach results from the fact that a stiffer seismic mass 102 adversely affects sensitivity of the signal to be measured due to reduced deflection of the material thereby limiting the sensitivity of the accelerometer.

One approach to minimize stiction involves optimizations at the system design level, such as the minimizing of electrostatic forces during normal operation while the accelerometer is being read out. The readout signal relates to the variable capacitance between seismic mass 102, as a first electrode, and sensing electrode 108, as a second electrode, of a capacitor geometry. Reading out the sensor involves applying a voltage to sensing electrode 108, which results in applying an electrostatic force that reduces restoring force 122 and, thus, worsens the stiction condition. In order to reduce stiction, the voltage that is applied to sensing electrode 108 should be kept relatively low, which can be easily accomplished by using proper design methods. However, reducing electrostatic forces, which is considered good engineering practice, plays only a minor role in the overall effect as it merely avoids worsening stiction rather than actively counteracting stiction forces.

Yet another approach to minimize stiction forces between electrodes targets manufacturing processes and surface conditioning. For example, in order to decrease the contact area between two surfaces that have a tendency adhere to each other, the surface roughness of, e.g., stopper 110 and seismic mass 102, is increased in order to reduce adhesion forces between the layers of material. In this context, anti-stiction materials can be used in the fabrication process in order to decrease the likelihood of stiction events to occur. However, such process solutions are cost intensive and typically do not lend themselves to mass production for high volume markets. Therefore, it would be desirable to have a system and methods that detect stiction conditions and allow for controlled recovery therefrom.

Figure 2:
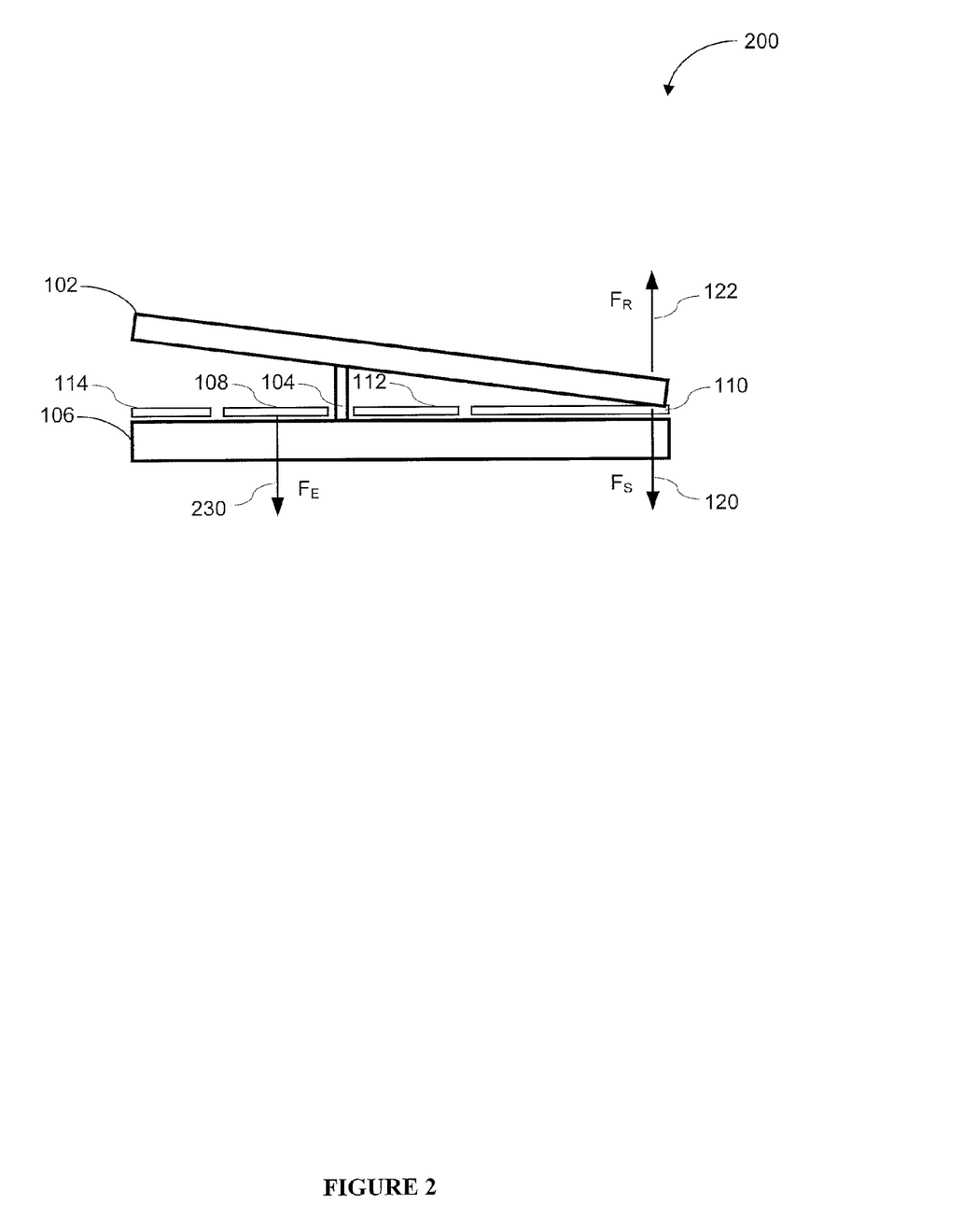
FIG. 2 is a general illustration of a MEMS device with improved restoring force during a stiction condition utilizing a static recovery mode, according to various embodiments of the invention.

FIG. 2 is a general illustration of a MEMS device with improved restoring force during a stiction condition utilizing a static recovery mode, according to various embodiments of the invention. Same numerals as in FIG. 1 denote similar elements.

Device 200 is any micromechanical MEMS type device known in the art that comprises a movable part. Device 200 comprises seismic mass 102, anchor 104, substrate 106, sensing electrode 108, and stopper electrode 110, which may be formed from a poly-Si layer. Anchor 104, may be a dielectric spacer that electrically insulates seismic mass 102 and suspends it at a nominal distance. Sensing electrode 108 may be formed from the same material as stopper electrode 110. Ideally, the material and electrical interconnections of stopper electrode 110 and seismic mass 102 are chosen such that no electrostatic force exists between the two electrodes.

In this static recovery mode of operation, as part of the stiction recovery procedure, electrostatic force 230 may be applied via a control circuit in response to detecting a stiction condition. In one embodiment, in order to recover from the stiction condition shown in FIG. 2, electrostatic voltage 230 is applied to one or more electrodes located on the opposite side of the anchoring point at which stiction occurs.

In detail, a bias voltage is applied to electrode 108, which produces electrostatic force 230 that acts on the section of seismic mass 102 located directly above electrode 108 by exerting a force in the direction of electrode 108. As can be easily derived for a given geometry, the initial electrostatic force is proportional to the square of the applied bias voltage. Electrostatic force 230 generates a torque that, in turn, exerts a force on mass 102 at the stiction location in the direction of the restoring force 122. In this manner, electrostatic force 230 adds to restoring force 122 to counteract stiction force 120 and advantageously increases the total static restoring force on seismic mass 102.

As a result, electrostatic force 230 aids in recovering mass 102 from the stiction condition. After recovery, mass 102 returns to its position that it had prior to the stiction event shown in FIG. 1A. Unlike prior art solutions, this embodiment allows for recovery from the stiction condition without sacrificing device performance. The arrangement in FIG. 2 provides the additional advantage that no electrodes other than the ones used by the readout circuit of device 200 are necessary to accomplish recovery of mass 102 from the stiction condition.

Figure 3A:
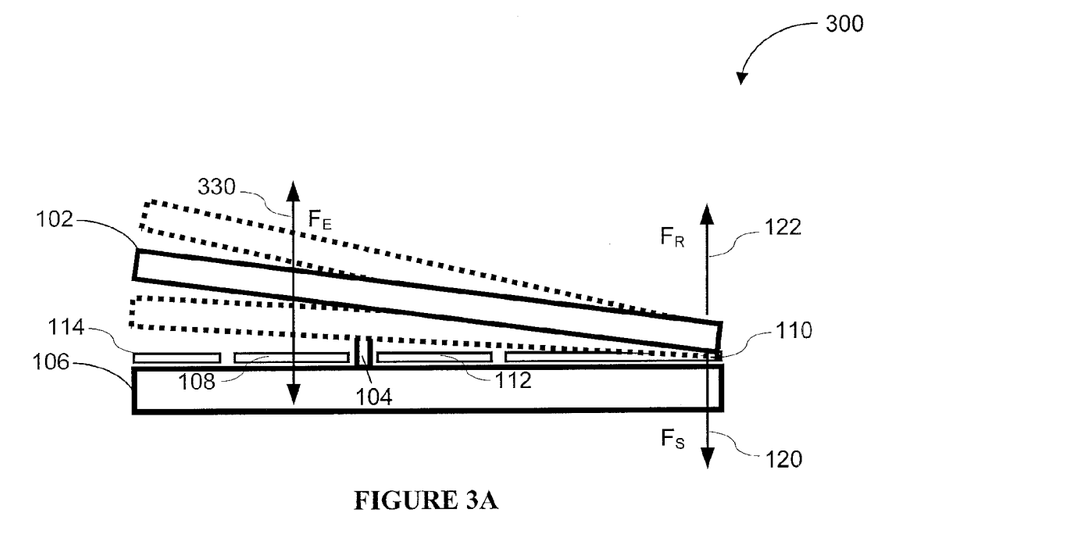
FIG. 3A illustrates a MEMS device with improved restoring force during a stiction condition utilizing a dynamic recovery mode, according to various embodiments of the invention.
Figure 3B:
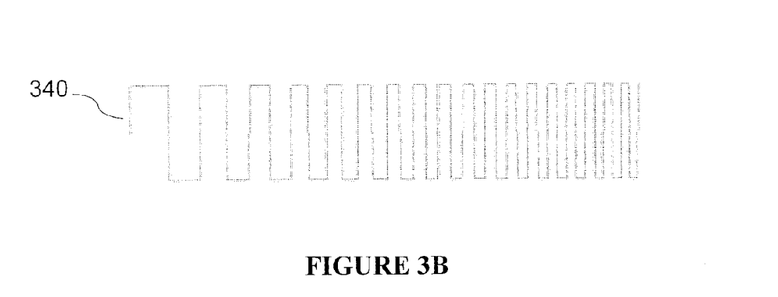
FIG. 3B is an exemplary voltage signal applied to MEMS device in FIG. 3A during a stiction condition when utilizing a dynamic recovery mode, according to various embodiments of the invention.

FIG. 3A illustrates a MEMS device with improved restoring force during a stiction condition utilizing a dynamic recovery mode, according to various embodiments of the invention. FIG. 3B is an exemplary voltage signal applied to MEMS device in FIG. 3A during a stiction condition when utilizing a dynamic recovery mode, according to various embodiments of the invention. For clarity and brevity, components similar to those shown in FIG. 2 are labeled in the same manner and a description or their function is not repeated.

As indicated by the dashed lines in FIG. 3A, seismic mass 102 of mechanical structure 300 is movable. When electrostatic force 330 is applied electrode 108, this causes seismic mass 102 to move. Electrostatic force 330 may be applied via a variable bias voltage signal, such as signal 340 shown in FIG. 3B, resulting in a dynamically varying force 330.

Voltage signal 340 may have a spectral content comprising frequencies. When a frequency of voltage signal 340 coincides with one or more resonance frequencies of seismic mass 102 suffering from the stiction condition, the motion is amplified to a maximum amplitude so as to enable seismic mass 102 to be released from stiction. In one embodiment, seismic mass 102 is designed to have a relatively low damping factor, such that excitation by a resonant frequency greatly increases the response amplitude of seismic mass 102, which increases restoring force 122 when compared to applying a simple static force.

In example in FIG. 3B, varying bias voltage signal 340 is a square wave voltage having a continuously increasing frequency. However, this is not intended as a limitation since the waveform of voltage signal 340 may have any profile, as long as its spectral content comprises one or more of the desired resonant frequencies. One of ordinary skill in the art will appreciate that voltage signal 340 may be optimized so as to maximize the energy transfer between electrode 108 and seismic mass 102.

In one embodiment, voltage signal 340 has an alternating waveform that changes values, e.g., between a positive polarity and zero at a fixed frequency. Ideally, the frequency coincides exactly with the resonant excitation frequency of the passive mass-spring system formed by seismic mass 102 rotating around the stiction point, such that the non-adhered side rotates around the anchor point in a vibrating fashion. However, material properties, geometry, and damping parameters, including air pressure, may not be exactly known or ascertainable through calculation or simulation studies. Device-to-device variations in the manufacturing process or varying environmental conditions may result in unpredictable non-idealities. Even within the same device, the exact location of the stiction point or area may be subject to the uncertainties of statistical variation. As a result, especially in high-Q systems (e.g., Q>50), any deviation from the actual resonant frequency rapidly decreases the effectiveness of the applied voltage in aiding the restoring force by reducing the amplitude of the desired mass movement.

Therefore, in order to ensure that applied force 330 results in the desired amplitude, in one embodiment, the excitation frequency is varied within an estimated or calibrated frequency range that encompasses the actual resonant frequency of the mass-spring system (e.g., 1 kHz-100 kHz). This may be accomplished by sweeping the voltage signal through a predetermined range of frequencies during the dynamic procedure, for example, from the lowest value in a desired frequency range to the highest value within a predetermined length of time (e.g., 50 ms-100 ms).

It is noted that the mass-spring equivalent model corresponding to the system under normal operating condition (i.e., able to perform acceleration measurements) and formed by seismic mass 102 rotating around the anchor may be distinct and operate at resonant frequencies different from those of the system described here.

In one embodiment, system parameters such as the applied voltage or the duration of the frequency sweep are calibrated in a manner so as to optimize the desired amplitude or recovery time. In one embodiment, voltage signal 340 is applied to electrode 108 located on the opposite side of anchor 104 at which the stiction occurs. In another embodiment, voltage signal 340 is applied to one or more electrodes that are used to perform the readout of the sensor, such that no additional electrodes are necessary to implement the embodiment. It is understood that the voltage may equally be applied to stopper electrode 114; one or more electrodes located above seismic mass 102; or other dedicated electrodes (e.g., split electrodes) to accomplish the goals of the invention.

Figure 4:
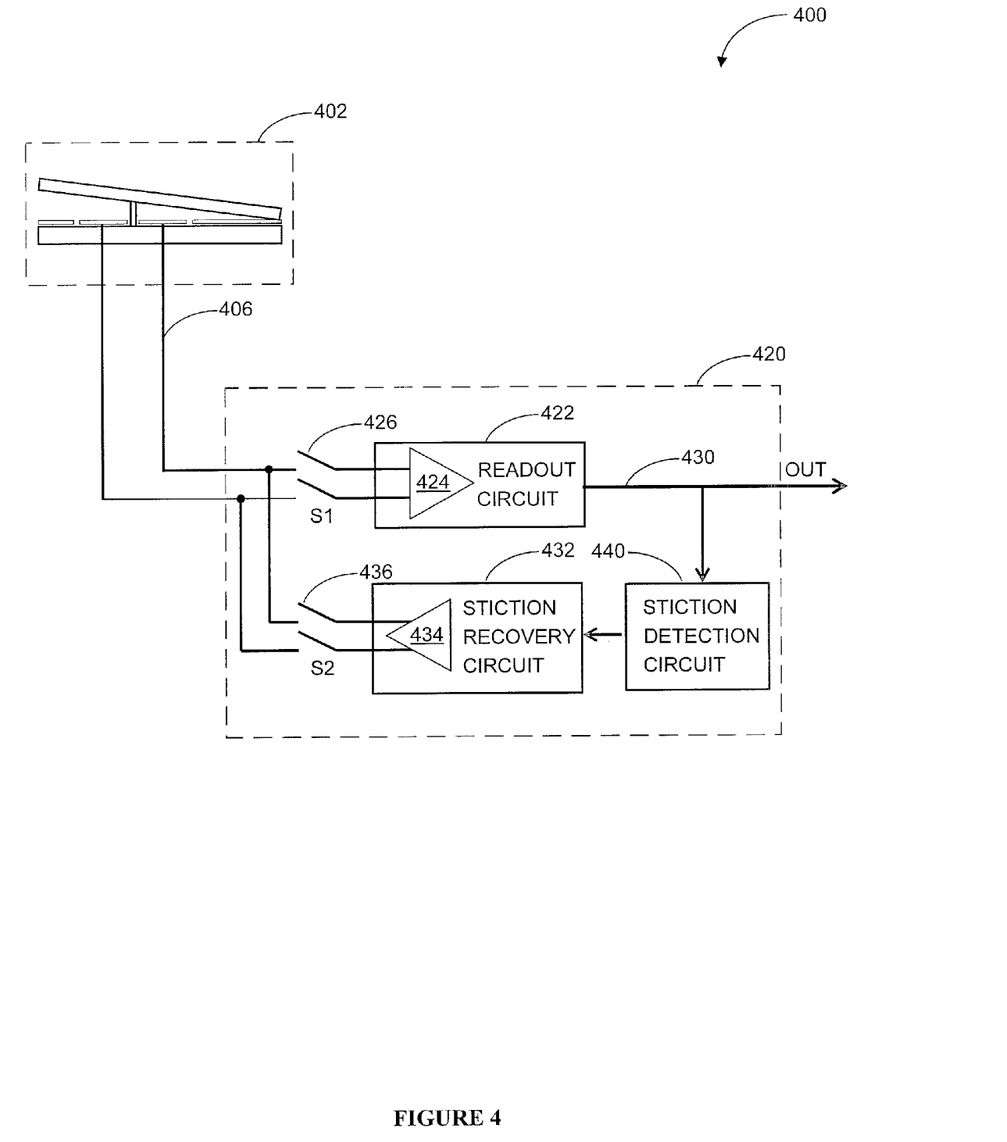
FIG. 4 is block diagram of an illustrative MEMS-related stiction recovery system according to various embodiments of the invention.

FIG. 4 is block diagram of an illustrative MEMS-related stiction recovery system according to various embodiments of the invention. Stiction recovery system 400 comprises MEMS device 402 and electronic interface circuit 420. The input signal 406 of electronic interface 420 is output signal of MEMS device 402. MEMS device 402 comprises mechanical components similar to the device shown in FIG. 2 and FIG. 3A and in this example is a z-axis accelerometer. MEMS device 402 interfaces with electronic interface circuit 420 that is designed to read input signal 406 generated by MEMS device 402 and convert it into an analog or digital readout signal 430 representative of the measured acceleration. Readout signal 430 may be further processed, for example, by another transducer die not shown in FIG. 4.

Electronic interface circuit 420 comprises switch 426, 436, accelerometer readout circuit 422 that is located at the output of the sensing chain, stiction recovery circuit 432, and stiction detection circuit 440, which is coupled to readout circuit 422 in a feedback type configuration, as shown in FIG. 4. Readout circuit 422 generates readout signal 430 based on input signal 406.

Stiction detection circuit 440 receives readout signal 430 and enables stiction recovery circuit 432 to apply a recovery voltage to MEMS device 402. Stiction detection circuit 440 may comprise analog or digital comparators and a timer that measures a period of time for which the stiction event is present, for example, by determining for how long the output signal exceeds a predetermined threshold. Stiction recovery circuit 432 comprises amplifier 434, which may be implemented as a charge pump to increase the recovery voltage prior to applying it to one or more electrodes of MEMS device 402.

In one embodiment, stiction recovery is performed in two distinct modes of operation. First, in normal operation mode electronic interface 420 reads out MEMS device 402. During this mode, stiction detection circuit 440 monitors readout signal 430 and identifies the presence of one of any number of possible condition representative of a stiction event. During this mode, switch Si 426 remains closed and switch S2 436 opened, such that the operation of stiction recovery circuit 432 does not affect output signal 430 during this operating condition.

Once stiction detection circuit 440 detects a stiction event, in a second mode, switch S2 436 is closed and switch S1 426 is opened to couple stiction recovery circuit 432 to MEMS device 402. In one embodiment, a stiction conditions is determined based on readout signal 430 exceeding a predetermined limit for a predetermined amount of time. For example, when charge amplifier 424 operates in saturation mode for more than 100 ms, this causes output signal 430 to produce an easily identifiable readout data. Once a stiction event is detected, stiction detection circuit 440 generates a trigger signal that is received by stiction recovery circuit 432, which initiates one of a static recovery mode or a dynamic recovery mode previously described (or a combination thereof) in order to actively restore the mechanical structure within MEMS device 402 to its original operating condition, so that MEMS device 402 can resume to measure acceleration.

In the dynamic recovery mode, in order to implement the frequency sweeping function, stiction recovery circuit 432 may comprise any waveform generator known in the art (e.g., a square wave generator) capable of generating the desired waveform. In certain embodiments, a stiction recovery voltage is applied on one or more sensing electrodes within MEMS device 402 without affecting system sensing performance, in part because during a stiction condition output signal 430 of the sensing chain is usually not particularly useful due to amplifier saturation. It is noted that the recovery voltage may be applied to dedicated electrodes not shown in FIG. 4.

In this example, the recovery voltage is applied to an electrode within MEMS device 402 that, during normal operation mode, is used by readout circuit 422 to read out a capacitance between a seismic mass and the electrode for the purpose of measuring the rotation of the seismic mass caused by the acceleration.

Monitoring, detection, or any other part of the recovery procedure may be optimized for a given mechanical structure having various stiction conditions and may be made transparent to a user, for example, by using the saturated output signal exclusively to perform a recovery procedure. In fact, rapid, successful recoveries may lead to an apparent reduction of stiction occurrences. Overall, the recovery procedures presented herein increase device reliability without negatively impacting device performance.

Figure 5:
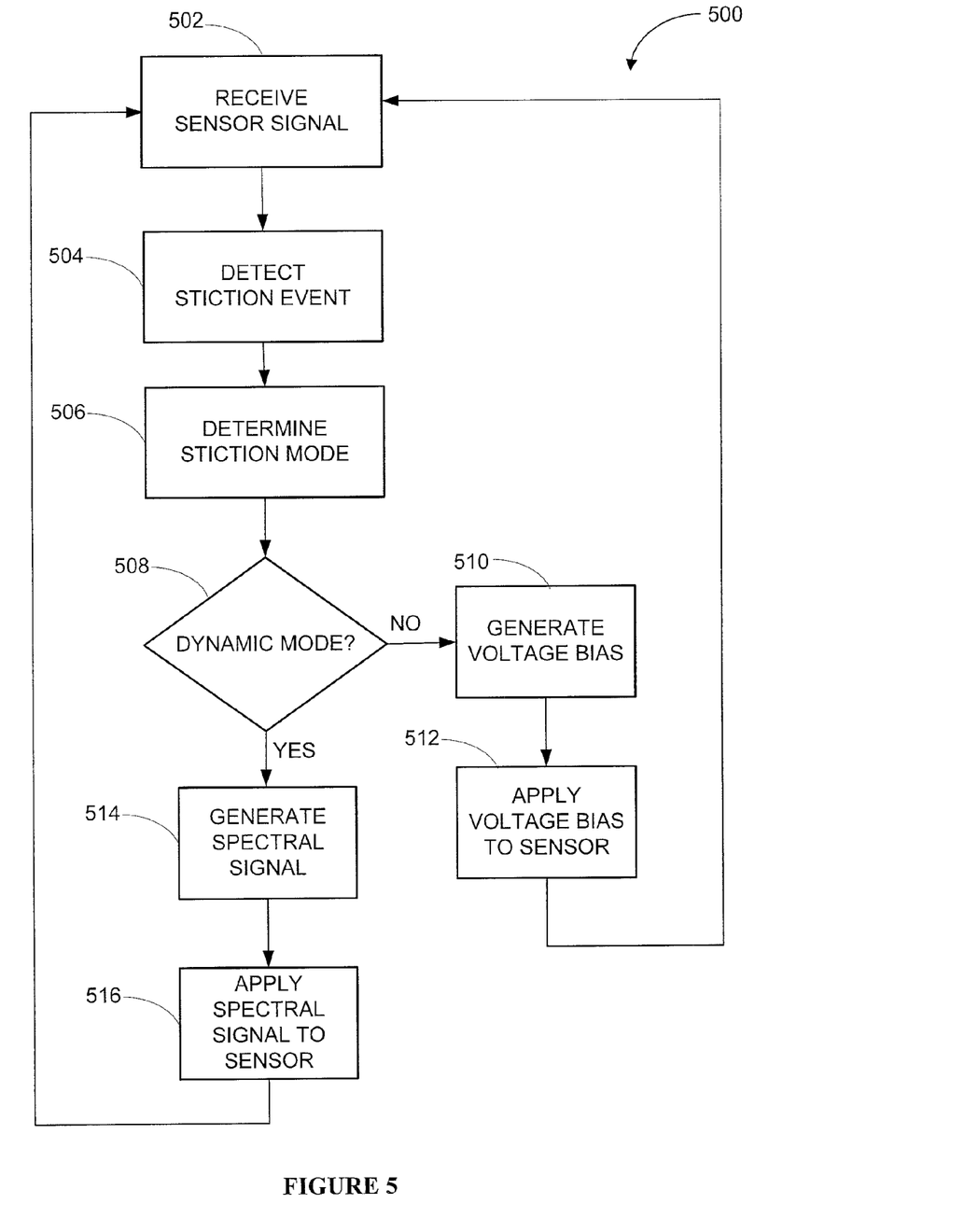
FIG. 5 is a flowchart of an illustrative process for stiction recovery in accordance with various embodiments of the invention.

FIG. 5 is a flowchart of an illustrative process for stiction recovery in accordance with various embodiments of the invention.

Process 500 to recover from stiction between two components of a MEMS device starts at step 502 when a sensor signal, such as a readout signal, is received, for example by a stiction detection circuit.

At step 504, a stiction event is detected, for example, from the readout signal.

At step 506, it is determined which of various recovery stiction modes to enter.

If, at step 506, it is determined that a static mode should be entered, then at step 510 a voltage bias signal is generated. Within the static mode, the voltage bias signal is applied to the sensor, at step 512.

On the other hand, if, at step 506, it is determined that a dynamic mode should be entered, then at step 514 a signal comprising a spectral component is generated. Then, within the dynamic mode at step 516, the spectral component is applied to a sensor.

It will be appreciated that the preceding examples and embodiments are exemplary and are for the purposes of clarity and understanding and not limiting to the scope of the present invention. It is further intended that all permutations, enhancements, equivalents, combinations, and improvements thereto that are apparent to those skilled in the art, upon a reading of the specification and a study of the drawings, are included within the scope of the present invention. It is therefore intended that the claims include all such modifications, permutations, and equivalents as fall within the true spirit and scope of the present invention.

The invention claimed is:

1. A circuit to recover from stiction, the circuit comprising:
    a stiction detection circuit coupled to receive a first signal from a MEMS device, the stiction detection circuit detects, based on the first signal, a stiction event between two components of the MEMS device; and
    a stiction recovery circuit coupled to the stiction detection circuit, the stiction recovery circuit generates a second signal in response to detecting the stiction event and applies the second signal to at least a mechanical structure of the MEMS device to cause an electrostatic force.

2. The circuit according to claim 1, wherein the second signal is one of a non-periodic waveform signal having a continuously increasing frequency, a non-periodic waveform signal having a continuously decreasing frequency, and static signal.

3. The circuit according to claim 1, wherein the stiction recovery circuit comprises a waveform generator capable of sweeping the second signal through a predetermined range of frequencies.

4. The circuit according to claim 1, wherein the mechanical structure of the MEMS device comprises a mass.

5. The circuit according to claim 4, wherein the second signal has a spectral content that comprises at least one frequency in common with a resonant frequency of the mass.

6. The circuit according to claim 4, wherein the electrostatic force is configured to increase a restoring force of the mass.

7. The circuit according to claim 4, wherein the mechanical structure of the MEMS device comprises an electrode, the electrode is configured to generate the electrostatic force on the mass.

8. The circuit according to claim 7, wherein the electrode is a sensor readout electrode that is configured to read the first signal.

9. The circuit according to claim 1, wherein the MEMS device is one of an acceleration sensor and an angular rate sensor.

10. A method to recover from stiction between two components of a MEMS device, the method comprising:
    receiving a first signal;
    detecting a stiction event based on the first signal;
    generating a second signal in response to detecting the stiction event; and
    applying the second signal to a mechanical structure to cause an electrostatic force.

11. The method according to claim 10, wherein applying the second signal comprises sweeping the second signal through a predetermined range of frequencies.

12. The method according to claim 11, further comprising calibrating the range of frequencies to increase a restoring force of a first mass.

13. The method according to claim 10, wherein the second signal has a spectral content that comprises at least one frequency in common with a resonant frequency of the mechanical structure comprising a second mass.

14. The method according to claim 10, wherein detecting the stiction event comprises detecting the presence of a saturation.

15. The method according to claim 10, wherein detecting the stiction event comprises detecting the presence of an over-threshold signal.

16. The method according to claim 10, further comprising determining a stiction recovery mode.

17. A system to recover from stiction between two components of a MEMS device, the system comprising:
    a MEMS device that generates a first readout signal;
    a readout circuit coupled to receive the first readout signal and convert it into a second readout signal;
    a stiction detection circuit coupled to the readout circuit, the stiction detection circuit detects a stiction event based on the second readout signal; and
    a stiction recovery circuit coupled to the stiction detection circuit, the stiction recovery circuit generates a voltage signal in response to detecting the stiction event and applies the voltage signal to at least one electrode of the MEMS device to cause an electrostatic force.

18. The system according to claim 17, further comprising a processing circuit coupled to receive and process the second readout signal.

19. The system according to claim 17, wherein the voltage signal is a bias voltage.

20. The system according to claim 17, wherein the voltage signal has a non-periodic square wave voltage having a continuously increasing or decreasing frequency.

* * * * *